United States Patent

Ogihara et al.

[11] Patent Number: 6,063,644
[45] Date of Patent: May 16, 2000

[54] LIGHT-EMITTING ELEMENT AND ARRAY WITH ETCHED SURFACE, AND FABRICATION METHOD THEREOF

[75] Inventors: Mitsuhiko Ogihara; Masumi Taninaka; Takatoku Shimizu; Hiroshi Hamano, all of Tokyo, Japan

[73] Assignee: Okidata Corporation, Tokyo, Japan

[21] Appl. No.: 09/145,278

[22] Filed: Sep. 2, 1998

[30] Foreign Application Priority Data

Sep. 22, 1997 [JP] Japan ................................ 9-256599

[51] Int. Cl.⁷ ................................................ H01L 21/20
[52] U.S. Cl. ........................ 438/45; 438/38; 438/46; 438/47; 257/94; 257/101; 372/45
[58] Field of Search ..................... 257/94, 101; 438/38, 438/45, 46, 47

[56] References Cited

U.S. PATENT DOCUMENTS 3,653,989  4/1972  Widmer .................................. 148/189
3,728,784  4/1973  Schmidt .................................. 29/578
5,084,742  1/1992  Tokuda ................................... 357/17

OTHER PUBLICATIONS

Yoshihiro Takekida, "Design of Optical Printers", Triceps, 1985, pp. 121–126.

*Primary Examiner*—Olik Chaudhuri
*Assistant Examiner*—Douglas A. Wille
*Attorney, Agent, or Firm*—Venable; Robert J. Frank

[57] ABSTRACT

A light-emitting element, or array of light-emitting elements, is formed by diffusion of an impurity into a semiconductor substrate, creating a light-emitting region. Following the diffusion, the surface zone of the light-emitting region, which includes crystal defects caused by the diffusion process, is removed by etching, thereby increasing the light-emitting efficiency by removing nonradiative recombination centers.

7 Claims, 6 Drawing Sheets

0.65 μm 0.65 μm

LIGHT-EMITTING ELEMENT AND ARRAY WITH ETCHED SURFACE, AND FABRICATION METHOD THEREOF

BACKGROUND OF THE INVENTION

The present invention relates to a light-emitting element such as a light-emitting diode, to an array of light-emitting elements, and to a fabrication method for the invented light-emitting element and array.

Light-emitting diodes or LEDs are widely employed as display and indicator devices, because they emit bright light and can be driven at low voltages by simple circuitry. LED arrays are used as light sources in electrophotographic printers.

A conventional LED or LED array is fabricated by diffusing a p-type impurity into an n-type compound semiconductor substrate, forming a pn junction at the diffusion front. Either vapor-phase or solid-phase diffusion can be employed. During the diffusion process, the substrate is heated to a high temperature, so while impurity atoms diffuse into the substrate, atoms also diffuse outward from the substrate, leaving crystal defects in the substrate. A large number of such crystal defects form near the surface of the substrate.

During operation, a forward voltage is applied, injecting minority carriers across the pn junction. Some of the injected minority carriers recombine with majority carriers by a radiative process, generating photons. Some of the generated photons reach the surface of the substrate and are emitted as light. Other photons are absorbed within the substrate.

Although recombination is most likely to occur near the pn junction, a certain fraction of the electrons injected into the p-type diffusion region reach the surface vicinity before recombining with holes. If the recombination is radiative, then since the generated photons have only a short distance to travel to the surface, their probability of being absorbed is low, and their probability of being emitted from the surface is high. Recombination near the surface is therefore a potentially important source of emitted light.

In conventional LEDs, however, recombination near the surface has a high probability of not being radiative. This is partly because of a surface potential with a deep energy level that promotes nonradiative recombination. However, another major factor is that the many crystal defects near the surface act as nonradiative recombination centers.

SUMMARY OF THE INVENTION

An object of the present invention is to increase the light-emitting efficiency of a light-emitting element, or an array of such elements.

The invented light-emitting element comprises a semiconductor substrate of a first conductive type, and a light-emitting region of a second conductive type formed by diffusion of an impurity into the semiconductor substrate, preferably by solid-phase diffusion. Following the diffusion, the surface zone of the light-emitting region, which includes crystal defects caused by the diffusion process, is removed by etching.

The invented array of light-emitting elements comprises a plurality of light-emitting elements as described above, sharing a common semiconductor substrate.

The invented method of fabricating a light-emitting element comprises a selective diffusion step and an etching step, both as described above.

By removing crystal defects that act as centers of nonradiative recombination, the etching step in the invented fabrication method increases the probability of radiative recombination of carriers in the invented light-emitting element or array. By removing surface material, the etching step also decreases the probability that photons generated near the pn junction will be absorbed before being emitted from the surface.

DETAILED DESCRIPTION OF THE INVENTION

Embodiments of the invention will be described with reference to the attached illustrative drawings. Further details of the prior art will also be shown, to illustrate the surface zone of the diffusion region, since the removal this zone is a key feature of the invention.

Figure 1:
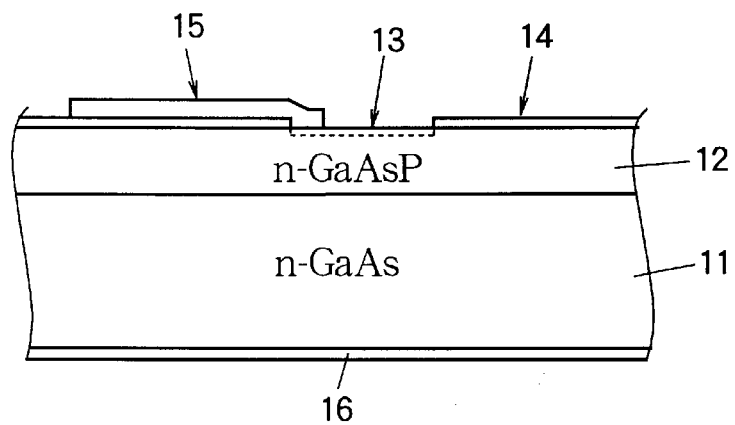
FIG. 1 is a sectional view of a conventional light-emitting diode.

FIG. 1 shows a conventional LED comprising an n-type gallium-arsenide (GaAs) substrate 11 with an n-type gallium-arsenide-phosphide (GaAsP) epitaxial layer 12, a p-type diffusion region 13, a silicon nitride (SiN) insulating film 14, an aluminum p-electrode 15, and a gold-germanium n-electrode 16. The p-type diffusion region 13, which is the light-emitting region, is created by diffusion of zinc into the epitaxial layer 12.

An array of LEDs of this type can be formed side-by-side in the same substrate, the array direction extending perpendicular to the drawing sheet. In an array, each LED has an individual p-electrode 15, while the n-electrode 16 serves as a common ground return.

Figure 2:
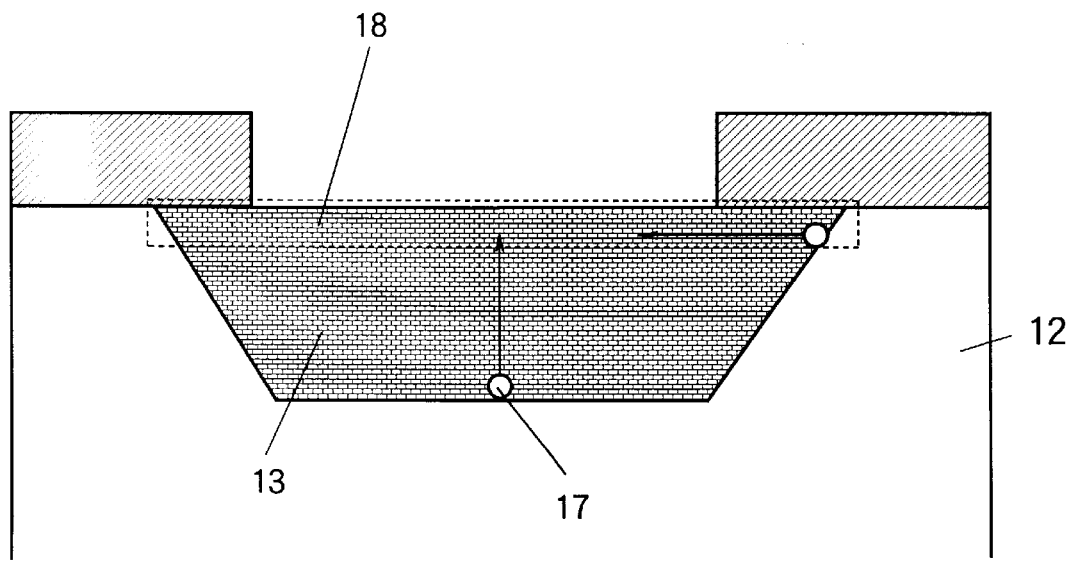
FIG. 2 is a sectional view illustrating the motion of injected electrons.

FIG. 2 schematically illustrates the paths of two injected electrons that recombine in the surface zone 18 of the diffusion region 13.

Figure 3:
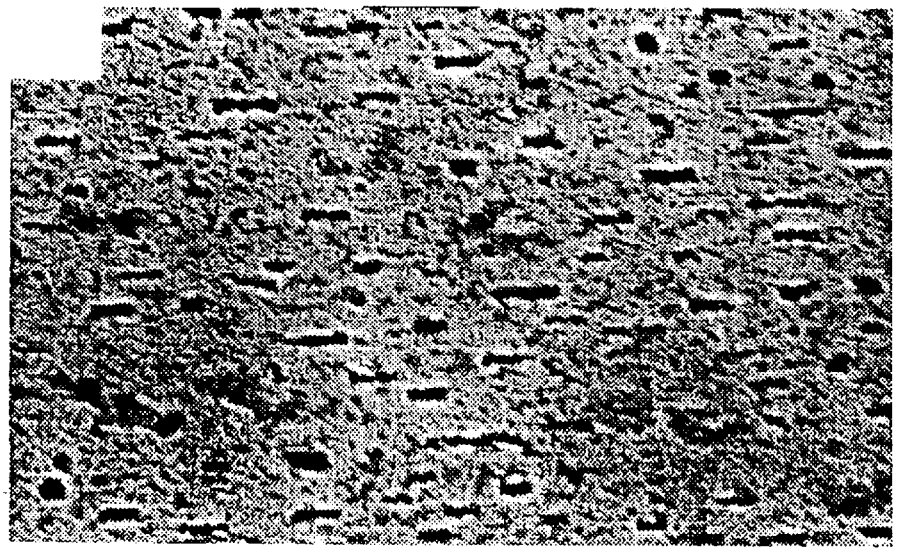
FIG. 3 is a scanning electron microscope photograph of the surface of the diffusion region.
Figure 4B:
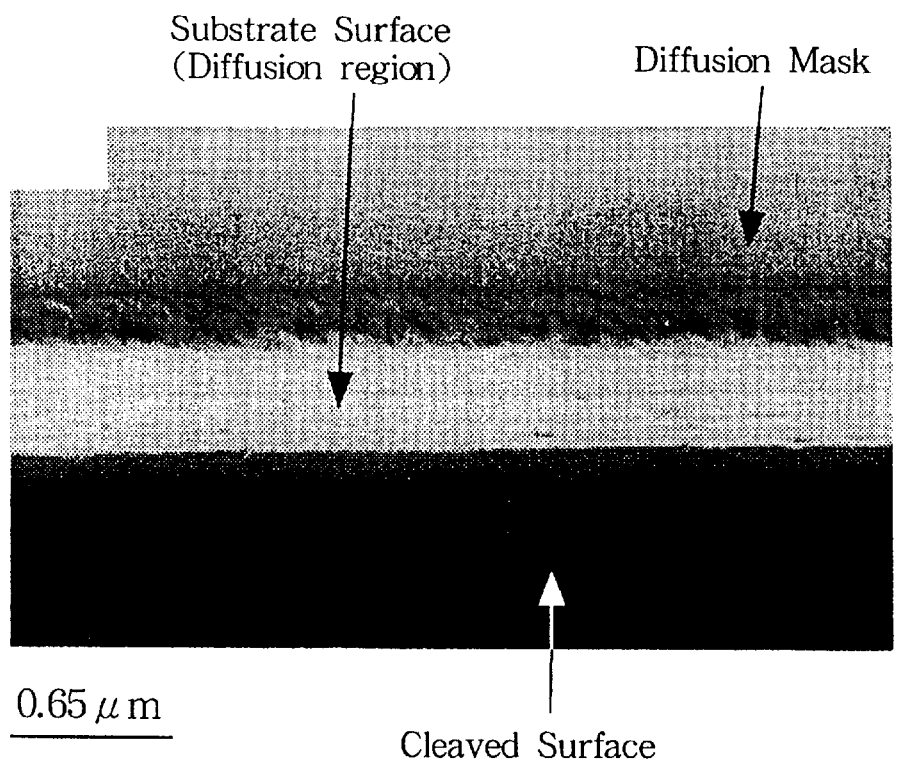
FIG. 4B is a scanning electron microscope photograph showing areas A and B in FIG. 4A.
Figure 4A:
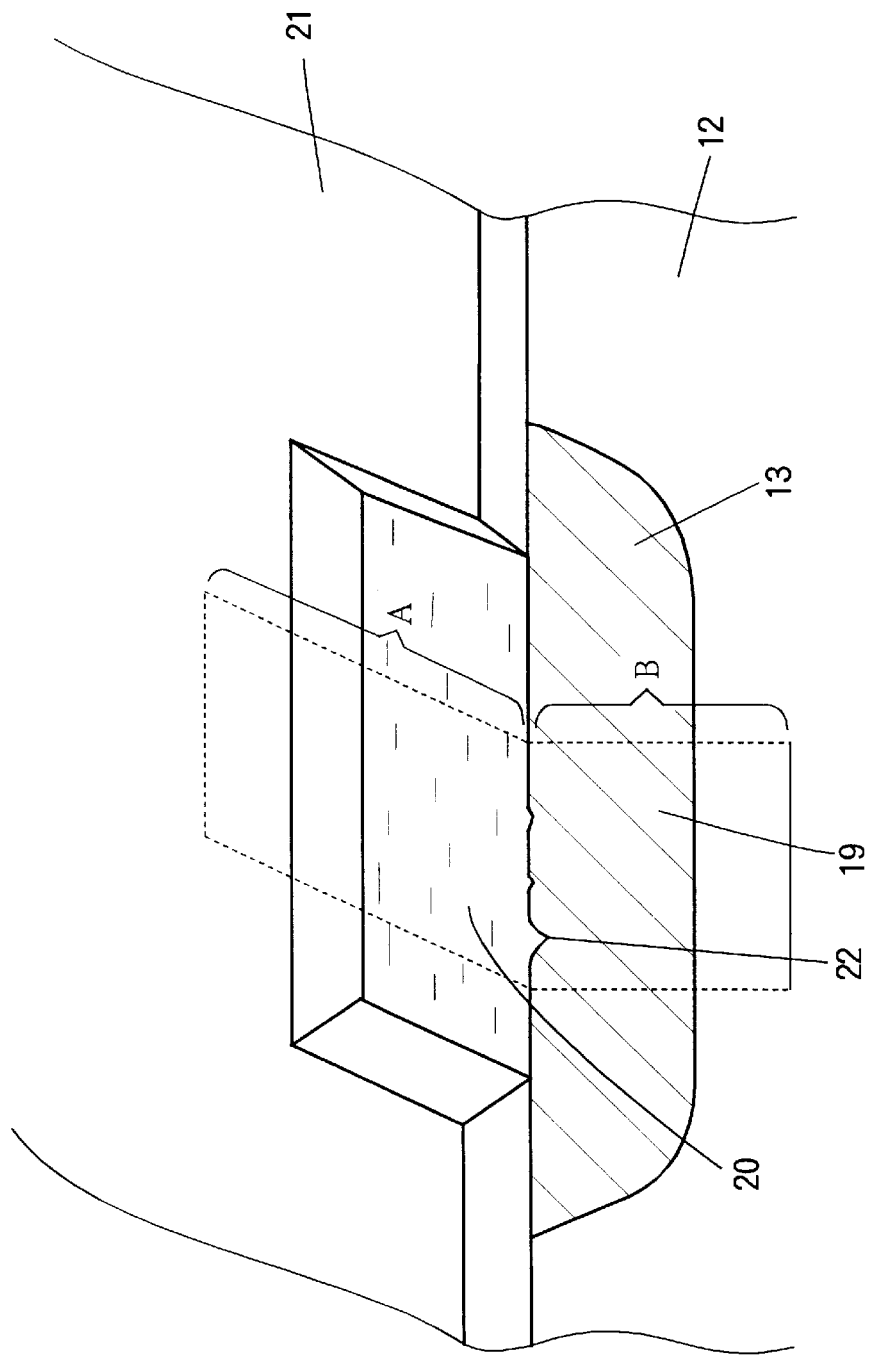
FIG. 4A shows a perspective view of a cleaved edge of a light-emitting diode.

FIG. 3 is a scanning electron microscope (SEM) photograph showing a plan view of the surface of the p-type diffusion region 13, revealing a large number of crystal defects due to, for example, the diffusion of arsenic atoms from the epitaxial layer 12. FIGS. 4A and 4B show a LED that has been cleaved to reveal the depth of the defects. FIG. 4B is a SEM photograph of the areas A and B outlined by the dashed line in FIG. 4A, showing part of the cleaved face 19 and surface 20 of the diffusion region 13, and part of the diffusion mask 21 used in forming the diffusion region 13. The crystal defects 22 can be seen to occur mainly in the upper thousand angstroms (1000 Å) of the epitaxial layer 12.

Figure 5:
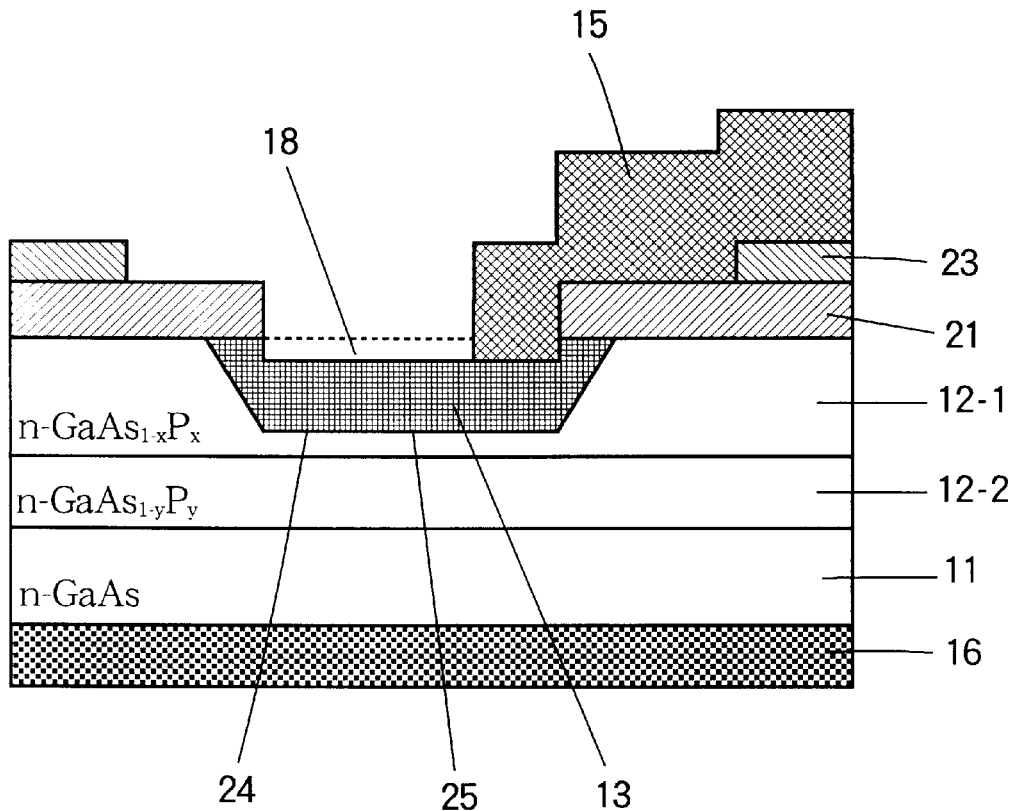
FIG. 5 is a sectional view of a LED in a LED array embodying the present invention.

FIG. 5 is a sectional view of a LED array embodying the present invention, showing a section through one LED in the array, using the same reference numerals as in FIG. 1 for equivalent elements. Vertical dimensions are exaggerated for clarity. The epitaxial layer comprises an upper epitaxial layer 12-1 of n-type $GaAs_{1-x}P_x$, where x is a fixed parameter greater than zero but less than one, and a lower epitaxial layer 12-2 of n-type $GaAs_{1-y}P_y$, where y varies from zero to x to provide a gradual transition between the GaAs substrate 11 and the upper epitaxial layer 12-1.

In place of the silicon nitride insulating film in FIG. 1, the diffusion mask 21 used in forming the p-type diffusion region 13 has been left as a first insulating film, and a second or inter-layer insulating film 23 has been added to assure better isolation between the p-electrode 15 and the substrate. The diffusion mask or first insulating film 21 comprises, for example, aluminum nitride (AlN). The inter-layer insulating film 23 comprises, for example, silicon nitride (SiN).

The diffusion depth of the p-type diffusion region 13 is substantially one micrometer (1 μm), but the surface zone 18 comprising the upper 0.2 μm of the p-type diffusion region 13 has been removed by etching in the area exposed by the first insulating film 21. As a result, the depth of the pn junction 24 at the floor 25 of the p-type diffusion region 13 is reduced from 1 μm to approximately 0.8 μm.

The carrier concentration in the p-type diffusion region 13 is substantially $1 \times 10^{20}/cm^3$. The resistivity of the p-type diffusion region 13 is therefore approximately two milliohm-centimeters (2 mΩcm). The length and width of the diffusion window in the first insulating film 21 are both 10 μm.

Reducing the thickness of the p-type diffusion region 13 by etching away the surface zone 18 increases the electrical resistance of the p-type diffusion region 13 by about twenty percent (20%), but with above the dimensions and carrier concentration, the increased resistance is still only about twenty-five ohms (25 Ω) With the driving currents typically employed in LED arrays, this resistance is too small to cause a significant voltage drop. With a driving current of three milliamperes (3 mA), for example, the voltage drop is only 0.075 V.

During operation, current fed from the p-electrode 15 spreads throughout the p-type diffusion region 13, injecting electrons across the entire pn junction 24. The mean free path Lm of electrons in the p-type diffusion region 13 is approximately 1 μm, substantially equal to the pn junction depth. The fraction n(Lx) of electrons injected at the floor 25 of the p-type diffusion region 13 that travel a distance Lx without recombining is given by the following formula, in which exp denotes the exponential function.

$$n(Lx) = \exp(-Lx/Lm)$$

The fraction of electrons that travel a distance Lm before recombining is thus exp(-1), or one divided by the mathematical constant e (1/e). The fraction of electrons that recombine with holes near the surface of the p-type diffusion region 13 is therefore approximately equal to 1/e. Roughly speaking, from thirty to forty percent (30%–40%) of the recombination takes place near the surface. This fraction is augmented by electrons injected from the sides of the p-type diffusion region 13, most of which recombine near the surface.

Removal of the surface zone 18 comprising the upper 0.2μm of the p-type diffusion region 13 removes substantially all of the defects visible in FIGS. 3 and 4B. The number of nonradiative recombination centers present near the surface of the p-type diffusion region 13 is thus greatly reduced. The probability of radiative recombination is increased correspondingly, resulting in increased emission of light from the surface.

Removal of the surface zone 18 also increases light emission by reducing the probability that photons generated in lower parts of the p-type diffusion region 13 will be absorbed. The invention accordingly increases the light-emitting efficiency of the LED by two separate mechanisms.

While the above embodiment has been described in terms of a LED array, the same structure can be employed in a LED that is not part of an array.

Next a fabrication process for the invented LED array or LED will be described.

Figure 6:
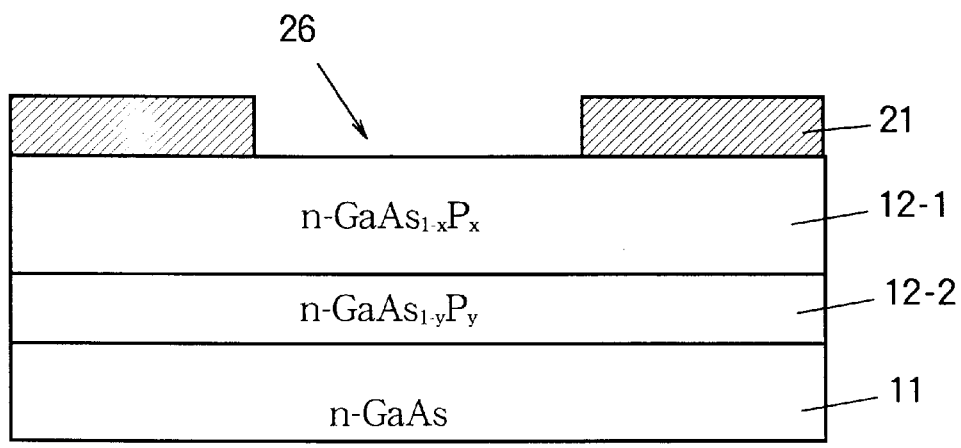
FIG. 6 is a sectional view illustrating a first step in a fabrication process embodying the present invention.

Referring to FIG. 6, a lower $GaAs_{1-y}P_y$ epitaxial layer 12-2 (y varying from zero to x) is grown on a GaAs wafer substrate 11, an upper $GaAs_{1-x}P_x$ epitaxial layer 12-1 is grown on the lower layer 12-2, an aluminum nitride film is deposited, and the aluminum nitride film is patterned to form a diffusion mask 21 with diffusion windows 26.

Figure 7:
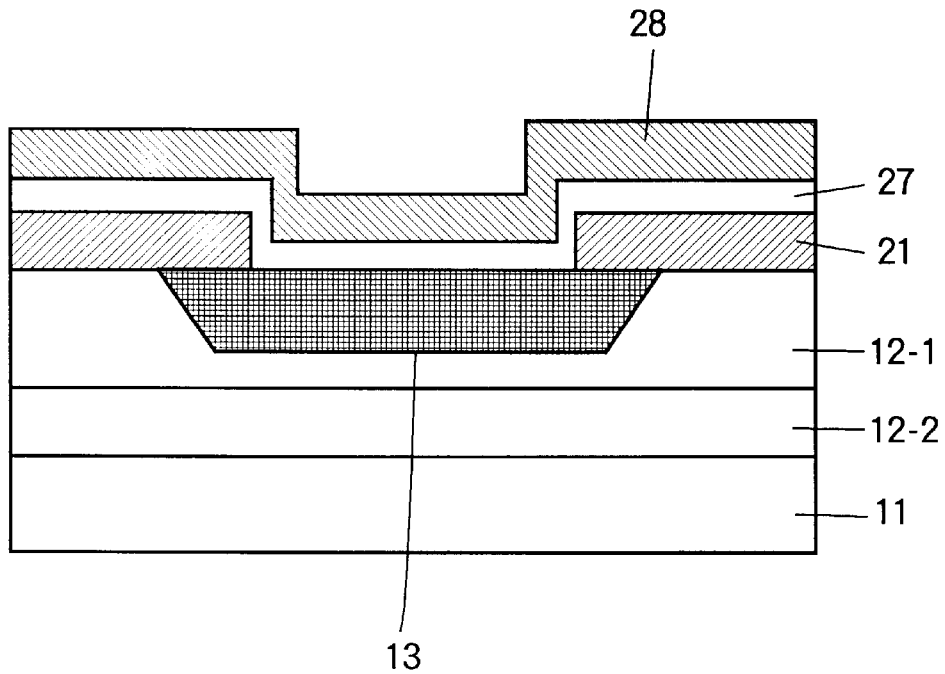
FIG. 7 is a sectional view illustrating a second step in the fabrication process.

Referring to FIG. 7, a diffusion-source film 27 comprising, for example, a mixture of zinc oxide (ZnO) and silicon dioxide ($SiO_2$) is deposited. The thickness of the diffusion-source film 27 is, for example, three hundred fifty angstroms (350 Å). Next, an anneal-cap film 28 comprising, for example, silicon nitride (SiN) is deposited. The thickness of the anneal-cap film 28 is, for example, five hundred angstroms (500 Å). The wafer is then annealed in a nitrogen atmosphere. The annealing conditions are, for example, 700° C. for one hour. The dimensions and conditions mentioned above enable a high carrier concentration of $1 \times 10^{20}/cm^3$ to be obtained, an advantage in a high-density LED array in which the size of the individual light-emitting regions is necessarily small.

Figure 8:
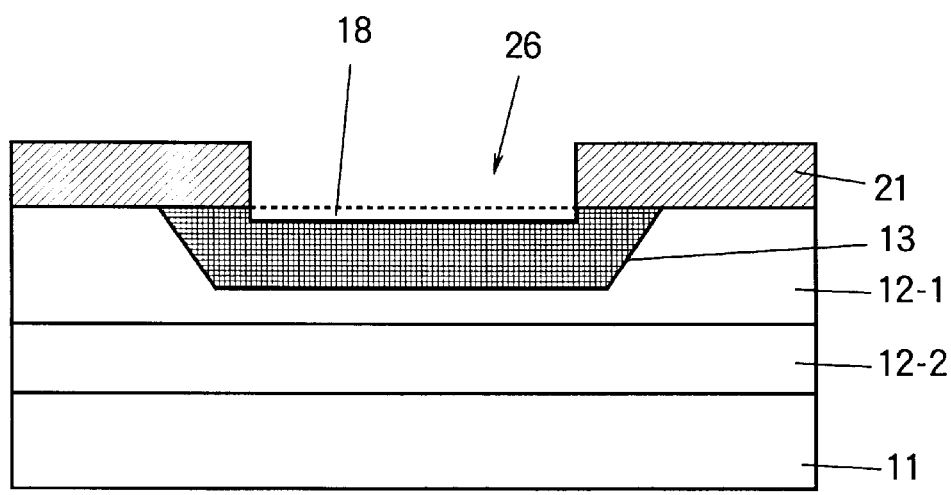
FIG. 8 is a sectional view illustrating a third step in the fabrication process.

Referring to FIG. 8, the anneal-cap film 28 and diffusion-source film 27 are now removed by etching with, for example, hydrofluoric acid (HF), or buffered HF. A further etching step is then carried out to remove the surface zone 18 of the p-type diffusion region 13. The etchant in this further etching step is, for example, an aqueous solution of phosphoric acid and hydrogen peroxide. The etching is allowed to proceed for sufficient time to remove the upper 0.2 μm of the p-type diffusion region 13.

The etching depth of 0.2 μm in this embodiment has been selected in relation to the electrical resistance of the p-type diffusion region 13. The electrical resistance must be low enough to permit adequate current spreading, so that light is emitted uniformly from the entire surface area of the p-type diffusion region 13. This requirement sets a maximum limit on the etching depth.

Figure 9:
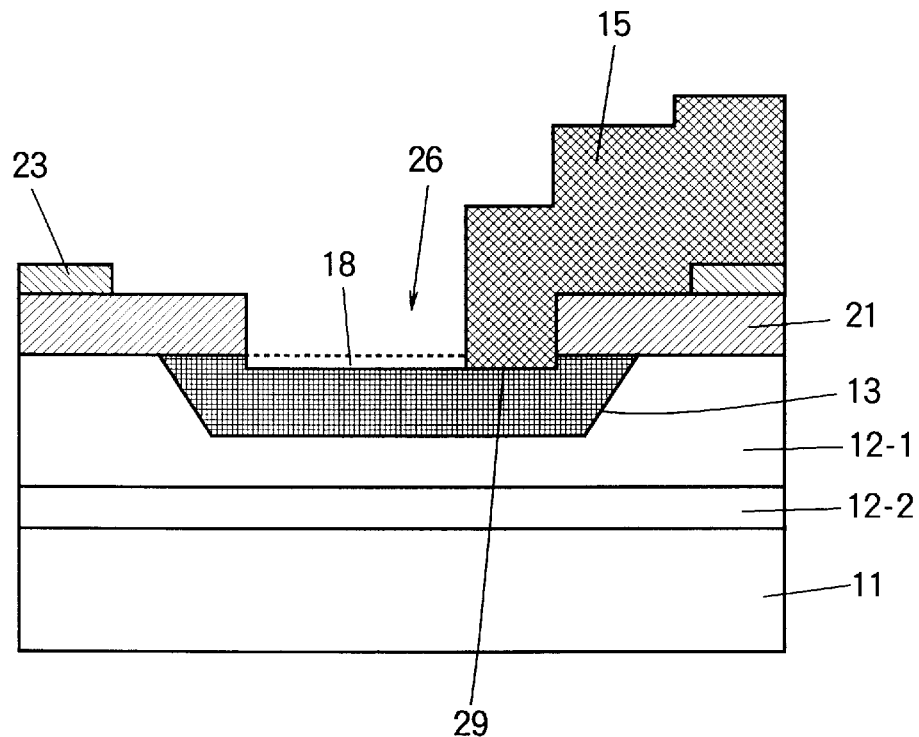
FIG. 9 is a sectional view illustrating a fourth step in the fabrication process.

Referring to FIG. 9, another silicon-nitride film is deposited and patterned to form the inter-layer insulating film 23. The patterning process may remove this film from the entire diffusion window 26, as shown in the drawing, but that is not strictly necessary, as long as enough of the second inter-layer insulating film 23 is removed to leave an exposed contact area 29 for the p-electrode 15 on the surface of the p-type diffusion region 13.

An aluminum film is then deposited and patterned by standard photolithography and etching techniques to create the p-electrode 15. Next, the wafer is sintered to form a good ohmic contact between the p-electrode 15 and the p-type diffusion region 13 in the contact area 29.

Figure 10:
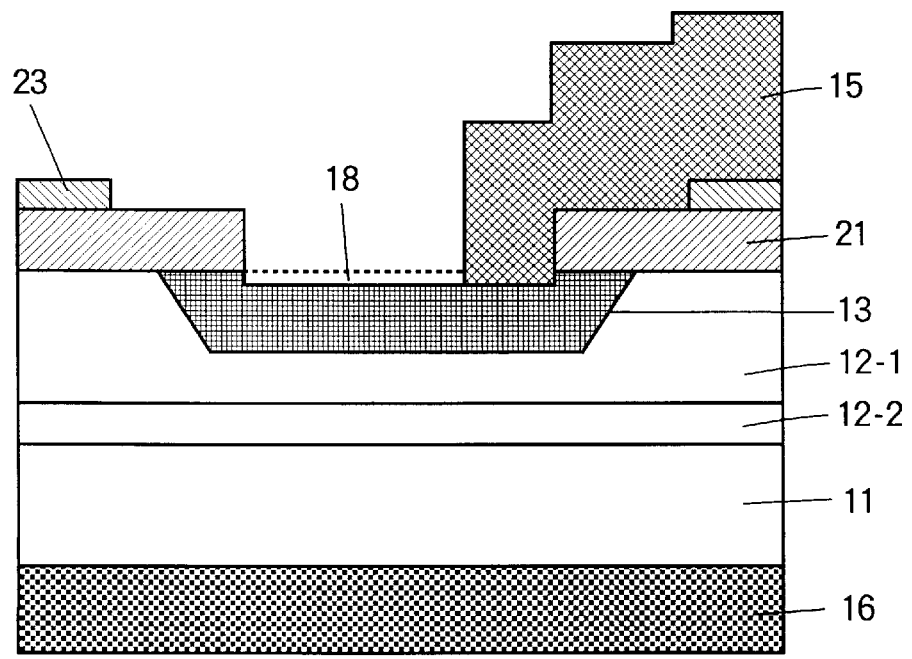
FIG. 10 is a sectional view illustrating a fifth step in the fabrication process.

Referring to FIG. 10, the final step is the formation of the n-electrode 16 on the underside of the wafer substrate 11. This step can be carried out by electron-beam evaporation of a mixture of gold-germanium, nickel, and gold (AuGe/Ni/Au), for example, followed by sintering to form a good ohmic contact.

The novel step in the above fabrication process is the etching step that removes the surface zone 18 of the p-type diffusion region 13, but the diffusion step and diffusion parameters are also relevant, because it is the high carrier density achieved in the diffusion step that enables the resistance of the p-type diffusion region 13 to remain sufficiently low even after the surface zone 18 is removed.

The invention is not limited to the materials described in the preceding embodiments. To mention just some of the possible alternatives, gallium arsenide (GaAs) or aluminum gallium arsenide ($Al_xGa_{1-x}As$) may be substituted for $GaAs_{1-x}P_x$. The diffusion-source film may comprise zinc oxide alone, or some other zinc-containing oxide, instead of a $ZnO\text{-}SiO_2$ mixture. The annealing conditions may be varied. An aluminum alloy or a gold alloy may be used instead of aluminum in the p-electrode 15.

The novel etching step that removes the surface zone 18 of the p-type diffusion region 13 may be performed after the formation of the p-electrode 15, using a photoresist etching mask. In this case, the surface zone 18 is not removed in the contact area 13, but that does not greatly impair the light-emitting performance, because almost all of the light emitted from the contact area 13 is blocked by the p-electrode 15.

If the diffusion mask is not left as an insulating film, then the novel etching step may be performed after the diffusion mask has been removed. In that case, the etching need not be confined to the surface zone of the p-type diffusion region; the entire wafer surface may be etched.

The embodiments described above enable highly efficient emission of light to be obtained from a dense linear array of light-emitting elements, but it is anticipated that the usefulness of the invention will not be limited to dense linear arrays.

Those skilled in the art will recognize that further variations are possible within the scope claimed below.

What is claimed is:

1. A method of fabricating a light-emitting element, comprising the steps of:

selectively diffusing an impurity of a second conductive type into a semiconductor substrate of a first conductive type, thereby forming a light-emitting region; and etching said semiconductor substrate, thereby removing a surface zone of said light-emitting region containing crystal defects caused by said step of selectively diffusing.

2. The method of claim 1, wherein said step of etching is confined to said light-emitting region.

3. The method of claim 1, further comprising the step of forming an electrode making electrical contact with said light-emitting region, after said step of etching.

4. The method of claim 1, further comprising the step of forming an electrode making electrical contact with said light-emitting region, before said step of etching.

5. The method of claim 1, wherein said step of selectively diffusing is carried out by solid-phase diffusion from a diffusion-source film.

6. The method of claim 5, wherein said diffusion-source film is an oxide film including zinc as said impurity.

7. The method of claim 6, wherein said oxide film comprises zinc oxide.

* * * * *